(12) United States Patent
Liu

(10) Patent No.: US 12,230,640 B2
(45) Date of Patent: Feb. 18, 2025

(54) DISPLAY DEVICE AND ELECTRONIC DEVICE

(71) Applicant: TCL China Star Optoelectronics Technology Co., Ltd., Guangdong (CN)

(72) Inventor: Jinfeng Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 612 days.

(21) Appl. No.: 17/600,327

(22) PCT Filed: Dec. 16, 2020

(86) PCT No.: PCT/CN2020/136738
§ 371 (c)(1),
(2) Date: Sep. 30, 2021

(87) PCT Pub. No.: WO2022/082972
PCT Pub. Date: Apr. 28, 2022

(65) Prior Publication Data
US 2022/0320145 A1    Oct. 6, 2022

(30) Foreign Application Priority Data

Oct. 23, 2020   (CN) .......................... 202011145736.X

(51) Int. Cl.
*H01L 27/12* (2006.01)
(52) U.S. Cl.
CPC ................................. *H01L 27/124* (2013.01)

(58) Field of Classification Search
CPC .......................... H01L 27/124; G02F 1/136286
See application file for complete search history.

(56) References Cited

U.S. PATENT DOCUMENTS

| 2008/0137016 | A1  | 6/2008  | Kim et al. |
| 2012/0306826 | A1* | 12/2012 | Tsuchi ................. G09G 3/2011 345/204 |
| 2015/0187294 | A1* | 7/2015  | Chen .................... G09G 3/3685 345/98 |
| 2015/0219945 | A1* | 8/2015  | Kimura ............... G02F 1/13306 349/152 |
| 2017/0154599 | A1* | 6/2017  | Huang ..................... G09G 3/20 |
| 2021/0035521 | A1* | 2/2021  | Qiu ....................... G09G 3/3688 |

FOREIGN PATENT DOCUMENTS

| CN | 104810002 | 7/2015 |
| CN | 107479275 | 12/2017 |
| CN | 107870488 | 4/2018 |

(Continued)

*Primary Examiner* — Peter M Albrecht

(57) ABSTRACT

The present disclosure provides a display device and an electronic device. The display device includes a display panel and a source driving chip. The display panel includes a plurality of traces in a fan-shaped distribution. A plurality of signal output terminals and a plurality of compensation traces are disposed in the source driving chip. The compensation traces are configured to reduce a resistance difference among the plurality of traces in a fan-shaped distribution, and each signal output terminal is electrically connected to a corresponding one of the traces in a fan-shaped distribution using one corresponding compensation trace.

5 Claims, 3 Drawing Sheets

(56) References Cited

FOREIGN PATENT DOCUMENTS

| | | |
|---|---|---|
| CN | 109061961 | 12/2018 |
| CN | 209373315 | 9/2019 |
| CN | 210223352 | 3/2020 |
| CN | 210223510 | 3/2020 |
| CN | 210325151 | 4/2020 |

* cited by examiner

DISPLAY DEVICE AND ELECTRONIC DEVICE

RELATED APPLICATIONS

This application is a National Phase of PCT Patent Application No. PCT/CN2020/136738 having International filing date of Dec. 16, 2020, which claims the benefit of priority of Chinese Patent Application No. 202011145736.X filed on Oct. 23, 2020. The contents of the above applications are all incorporated by reference as if fully set forth herein in their entirety.

FIELD AND BACKGROUND OF THE INVENTION

The present disclosure relates to the technical field of display, and in particular, to a display device and an electronic device.

BACKGROUND OF INVENTION

In a display panel, in order to realize different display pictures, a source driving chip usually provides data voltages for displaying different pictures for data lines. When a resolution of the display panel is relatively high (that is, there is a large number of data line columns of the display panel), an area of a display area controlled by the same source driving chip is increased, which may cause, to present a structure of various lengths, traces in a fan-shaped distribution in a fan-shaped area connected to the source driving chip (the fan-shaped area refers to a trace area located between the data line and the source driving chip, and the trace area is referred to as a fan-shaped area because a shape of the entire trace area is similar to a fan). In other words, resistance values of a plurality of traces in a fan-shaped distribution are different, which in turn causes data signal voltages outputted from the source driving chip to generate different voltage drops, resulting in uneven display of the display panel.

SUMMARY OF THE INVENTION

In a display panel, traces in a fan-shaped distribution in a fan-shaped area present a structure of various lengths, that is, resistance values of a plurality of traces in a fan-shaped distribution are different, which in turn causes data signal voltages outputted from a source driving chip to generate different voltage drops, resulting in uneven display of the display panel.

The present disclosure provides a display device and an electronic device, so as to resolve the technical problem of uneven display of a display panel due to a difference in resistance values of a plurality of traces in a fan-shaped distribution in the conventional technology.

The present disclosure provides a display device, including:
  a display panel, including a plurality of traces in a fan-shaped distribution; and
  a source driving chip, in which a plurality of signal output terminals and a plurality of compensation traces are disposed, wherein the compensation traces are configured to reduce a resistance value difference among the plurality of traces in a fan-shaped distribution, the plurality of signal output terminals, the plurality of traces in a fan-shaped distribution, and the plurality of compensation traces are in a one-to-one correspondence, and each signal output terminal is electrically connected to a corresponding one of the traces in a fan-shaped distribution using one corresponding compensation trace.

In the display device provided in the present disclosure, the plurality of traces in a fan-shaped distribution are arranged at intervals in a first direction, in the first direction, resistance values of a first one of the traces in a fan-shaped distribution to a middle one of the traces in a fan-shaped distribution decrement, and resistance values of the middle one of the traces in a fan-shaped distribution to a last one of the traces in a fan-shaped distribution increment;
  resistance values of a first compensation trace to a middle compensation trace in a one-to-one correspondence with the first one of the traces in a fan-shaped distribution to the middle one of the traces in a fan-shaped distribution increment; and resistance values of the middle compensation trace to a last compensation trace in a one-to-one correspondence with the middle one of the traces in a fan-shaped distribution to the last one of the traces in a fan-shaped distribution decrement.

In the display device provided in the present disclosure, widths of the plurality of compensation traces are equal;
  lengths of the first compensation trace to the middle compensation trace increment;
  and lengths of the middle compensation trace to the last compensation trace decrement.

In the display device provided in the present disclosure, lengths of the plurality of compensation traces are equal;
  widths of the first compensation trace to the middle compensation trace decrement;
  and widths of the middle compensation trace to the last compensation trace increment.

In the display device provided in the present disclosure, lengths of the first compensation trace to the middle compensation trace increment, and lengths of the middle compensation trace to the last compensation trace decrement; and widths of the first compensation trace to the middle compensation trace decrement, and widths of the middle compensation trace to the last compensation trace increment.

In the display device provided in the present disclosure, at least one compensation trace includes a plurality of compensation sub-traces connected in parallel.

In the display device provided in the present disclosure, the compensation traces are in a shape of a broken line or a straight line.

In the display device provided in the present disclosure, the display panel includes a plurality of fan-shaped sub-areas, and each fan-shaped sub-area includes the plurality of traces in a fan-shaped distribution; and
  resistance values of the compensation traces correspondingly connected to the traces in a fan-shaped distribution in the each fan-shaped sub-area are equal.

In the display device provided in the present disclosure, the each fan-shaped sub-area includes a same quantity of traces in a fan-shaped distribution.

the present disclosure further provides an electronic device, including a display device, the display device including:
  a display panel, including a plurality of traces in a fan-shaped distribution; and
  a source driving chip, in which a plurality of signal output terminals and a plurality of compensation traces are disposed, wherein the compensation traces are configured to reduce a resistance value difference among the plurality of traces in a fan-shaped distribution, the plurality of traces in a fan-shaped distribution, the plurality of signal output terminals, and the plurality of compensation traces are in a one-to-one correspondence, and each signal output terminal is electrically connected to a corresponding one of the traces in a fan-shaped distribution using one corresponding compensation trace.

In the electronic device provided in the present disclosure, the plurality of traces in a fan-shaped distribution are arranged at intervals in a first direction, in the first direction, resistance values of a first one of the traces in a fan-shaped distribution to a middle one of the traces in a fan-shaped distribution decrement, and resistance values of the middle one of the traces in a fan-shaped distribution to a last one of the traces in a fan-shaped distribution increment;

resistance values of a first compensation trace to a middle compensation trace in a one-to-one correspondence with the first one of the traces in a fan-shaped distribution to the middle one of the traces in a fan-shaped distribution increment; and resistance values of the middle compensation trace to a last compensation trace in a one-to-one correspondence with the middle one of the traces in a fan-shaped distribution to the last one of the traces in a fan-shaped distribution decrement.

In the electronic device provided in the present disclosure, widths of the plurality of compensation traces are equal;

lengths of the first compensation trace to the middle compensation trace increment;

and lengths of the middle compensation trace to the last compensation trace decrement.

In the electronic device provided in the present disclosure, lengths of the plurality of compensation traces are equal;

widths of the first compensation trace to the middle compensation trace decrement;

and widths of the middle compensation trace to the last compensation trace increment.

In the electronic device provided in the present disclosure, lengths of the first compensation trace to the middle compensation trace increment, and lengths of the middle compensation trace to the last compensation trace decrement; and widths of the first compensation trace to the middle compensation trace decrement, and widths of the middle compensation trace to the last compensation trace increment.

In the electronic device provided in the present disclosure, at least one compensation trace includes a plurality of compensation sub-traces connected in parallel.

In the electronic device provided in the present disclosure, the compensation traces are in a shape of a broken line or a straight line.

In the electronic device provided in the present disclosure, the display panel includes a plurality of fan-shaped sub-areas, and each fan-shaped sub-area includes the plurality of traces in a fan-shaped distribution; and resistance values of the compensation traces correspondingly connected to the traces in a fan-shaped distribution in the each fan-shaped sub-area are equal.

In the electronic device provided in the present disclosure, the each fan-shaped sub-area includes a same quantity of traces in a fan-shaped distribution.

Distances between the plurality of signal output terminals and the corresponding traces in a fan-shaped distribution are equal.

The present disclosure provides a display device and an electronic device. The display device includes: a display panel, including a plurality of traces in a fan-shaped distribution; a source driving chip, in which a plurality of signal output terminals and a plurality of compensation traces are disposed, wherein the compensation traces are configured to reduce a resistance value difference among the plurality of traces in a fan-shaped distribution, the plurality of traces in a fan-shaped distribution, the plurality of signal output terminals, and the plurality of compensation traces are in a one-to-one correspondence, and each signal output terminal is electrically connected to a corresponding one of the traces in a fan-shaped distribution using one corresponding compensation trace. In the present disclosure, a compensation trace is arranged between each signal output terminal and a corresponding one of the traces in a fan-shaped distribution, thereby reducing differences in resistance values between a plurality of traces in a fan-shaped distribution and improving display unevenness of a display panel. In addition, the compensation traces are arranged inside a source driving chip, which effectively utilizes an internal space of the source driving chip, facilitating a narrow frame design of the display panel.

BRIEF DESCRIPTION OF THE SEVERAL VIEWS OF THE DRAWINGS

To describe the technical solutions in the embodiments of this application more clearly, the accompanying drawings required for describing the embodiments are briefly described hereinafter. Apparently, the accompanying drawings in the following descriptions show merely some embodiments of this application, and a person skilled in the art may obtain other accompanying drawings according to these accompanying drawings without creative efforts.

DESCRIPTION OF SPECIFIC EMBODIMENTS OF THE INVENTION

The technical solutions of the embodiments of the present disclosure are clearly and completely described in the following with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

Figure 1:
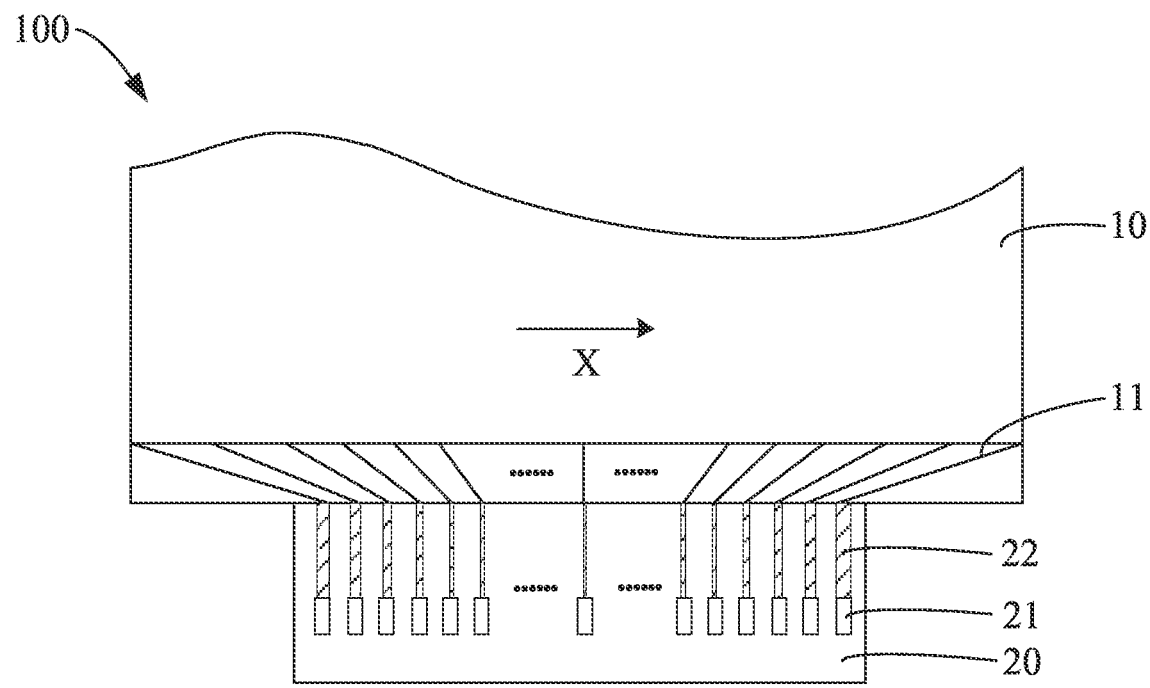
FIG. 1 is a schematic diagram of a first structure of a display device according to the present disclosure.

Referring to FIG. 1, FIG. 1 is a schematic diagram of a first structure of a display device according to the present disclosure.

As shown in FIG. 1, a display device 100 provided in the present disclosure includes: a display panel 10, including a plurality of traces 11 in a fan-shaped distribution; and a source driving chip 20, in which a plurality of signal output terminals 21 and a plurality of compensation traces 22 are disposed. The compensation traces 22 are configured to reduce a resistance value difference among the plurality of traces 11 in a fan-shaped distribution. The plurality of traces 11 in a fan-shaped distribution, the plurality of signal output terminals 21, and the plurality of compensation traces 22 are in a one-to-one correspondence, and each signal output terminal 21 is electrically connected to a corresponding one of the traces 11 in a fan-shaped distribution using one corresponding compensation trace 22.

Therefore, the present disclosure provides a display device 100. A compensation trace 22 is arranged between each signal output terminal 21 and a corresponding one of the traces 11 in a fan-shaped distribution, thereby reducing a data signal transmission difference caused by a resistance value difference among a plurality of traces in a fan-shaped distribution 11, and improving display unevenness of a display panel 10. In addition, in the present disclosure, the compensation traces 22 are arranged inside a source driving chip 20, which effectively utilizes an internal space of the source driving chip 20. Compared with the conventional technology, the solution of disposing a compensation circuit in the display panel facilitates a narrow frame design of the display panel 10.

It is to be noted that, in the description of the present disclosure, "a plurality of" means two or more, unless otherwise explicitly defined in detail.

In the embodiment of the present disclosure, materials of the traces 11 in a fan-shaped distribution and the compensation traces 22 can be one or more of conductive materials such as copper, aluminum, molybdenum, silver, or the like that have a relatively low resistivity, which is not limited in detail in the present disclosure.

In the embodiment of the present disclosure, the compensation traces 22 can be formed using the same process during manufacturing of an integrated circuit in the source driving chip 20. The process is a technology well known to those skilled in the art, and details are not described herein again.

In addition, at a production end of the source driving chip 20, for the display panel 10 of the same model, the source driving chip 20 having the corresponding compensation trace 22 can be mass-produced according to parameter information of a fanout area of the display panel, so as to effectively utilize the internal space of the electrode driving chip 20, compensate for resistance values of the plurality of traces in a fan-shaped distribution 11 in the corresponding display panel 10, and reduce the complexity of producing the source driving chip 20. "The same model" can be understood as a plurality of display panels having the same type, the same size, and the same pixel resolution, and the like.

In the embodiment of the present disclosure, distances between the plurality of signal output terminals 21 and the corresponding traces 11 in a fan-shaped distribution are equal. That is, in the source driving chip 20, except for the resistance value difference among the plurality of compensation traces 22, other circuit structures are kept the same to avoid affecting working performance of the source driving chip 20.

In the embodiment of the present disclosure, the compensation traces 22 can be in a shape of a broken line, a straight line, or a curved line, and can be designed in detail according to actual requirements.

In the embodiment of the present disclosure, the source driving chip 20 can be directly disposed on the display panel 10, or can be bound to the display panel 10 using a chip on film (COF). A quantity of the source driving chips 20 can be one or more, which can be designed in detail according to the size and a pixel resolution of the display panel 10, which is not limited in detail in the present disclosure.

In the embodiment of the present disclosure, the plurality of traces 11 in a fan-shaped distribution are arranged at intervals in a first direction X, in the first direction X, resistance values of a first one of the traces 11 in a fan-shaped distribution to a middle one of the traces 11 in a fan-shaped distribution decrement, and resistance values of the middle one of the traces 11 in a fan-shaped distribution to a last one of the traces 11 in a fan-shaped distribution increment. Resistance values of a first compensation trace 22 to a middle compensation trace 22 in a one-to-one correspondence with the first one of the traces 11 in a fan-shaped distribution to the middle one of the traces 11 in a fan-shaped distribution increment. Resistance values of the middle compensation trace 22 to a last compensation trace 22 in a one-to-one correspondence with the middle one of the traces 11 in a fan-shaped distribution to the last one of the traces 11 in a fan-shaped distribution decrement.

In the first direction X, the first one of the traces 11 in a fan-shaped distribution and the last one of the traces 11 in a fan-shaped distribution are respectively located on two sides of the display panel 10, and the middle one of the traces 11 in a fan-shaped distribution is located at a central position of the display panel 10. Similarly, in the first direction X, the first compensation trace 22 and the last compensation trace 22 are located on two sides of the source driving chip 20, and the middle compensation trace 22 is located at a central position of the source driving chip 20.

Figure 2:
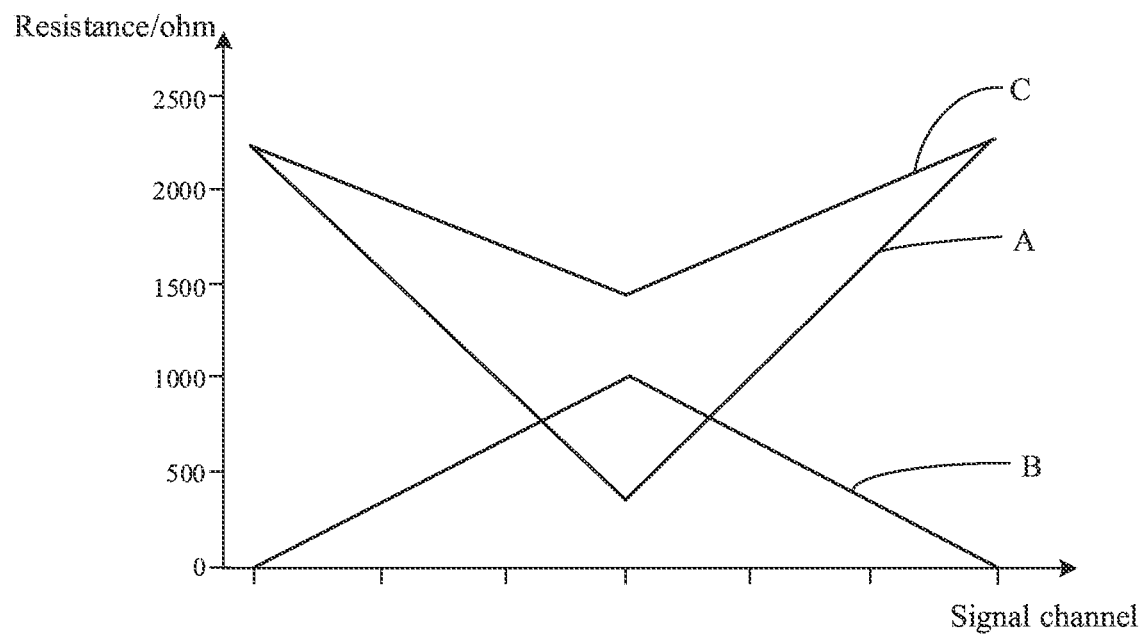
FIG. 2 is a distribution diagram of resistance values of traces in a fan-shaped distribution and compensation traces corresponding to different signal channels in the display device shown in FIG. 1.

In detail, referring to FIG. 2, FIG. 2 is a distribution diagram of resistance values of traces in a fan-shaped distribution and compensation traces corresponding to different signal channels in the display device shown in FIG. 1.

An abscissa in FIG. 2 represents the signal channel between the display panel 10 and the source driving chip 20, and each signal channel corresponds to one of the traces 11 in a fan-shaped distribution and a compensation trace 22. An ordinate represents resistance in ohm. A curve A in FIG. 2 refers to a resistance value distribution of a plurality of traces 11 in a fan-shaped distribution in the first direction X. A curve B in FIG. 2 refers to a resistance value distribution of a plurality of compensation traces 22 in the first direction X. A curve C in FIG. 2 refers to a distribution of equivalent resistance values corresponding to a plurality of signal channels in the first direction X. It may be learned that the compensation traces 22 reduce a resistance value difference of traces between the source driving chip 20 and the display panel 10 caused by the plurality of traces 11 in a fan-shaped distribution.

In addition, in ideal conditions, the curve C can be a straight line parallel to the abscissa, and the resistance value difference caused by the plurality of traces 11 in a fan-shaped distribution can be completely eliminated using the plurality of compensation traces 22.

It should be noted that, in some embodiments, due to errors in the process, or in the display panel 10, the corresponding resistance adjustments have been made for the plurality of traces 11 in a fan-shaped distribution. Therefore, in the first direction X, the resistance values of the plurality of traces 11 in a fan-shaped distribution may not present a regular change shown in FIG. 2. However, as long as the corresponding compensation trace 22 is disposed corresponding to each of the traces 11 in a fan-shaped distribution in the source driving chip 20, these are all within the protection scope of the present disclosure.

In the following embodiments of the present disclosure, that "in the first direction X, resistance values of a first one of the traces 11 in a fan-shaped distribution to a middle one of the traces 11 in a fan-shaped distribution decrement, and resistance values of the middle one of the traces 11 in a fan-shaped distribution to a last one of the traces 11 in a fan-shaped distribution increment" is used as an example for description, but this cannot be understood as a limitation on the present disclosure.

Referring to FIG. 1, in an embodiment of the present disclosure, lengths of the plurality of compensation traces 22 are equal. In the first direction X, widths of the first compensation trace 22 to the middle compensation trace 22 decrement. Widths of the middle compensation trace 22 to the last compensation trace 22 increment.

It can be understood that the formula for calculating the resistance values of the traces is: $R=\rho L/S$. $\rho$ is a resistivity of the trace, which is determined by the properties of the trace itself, L is a length of the trace, and S is a cross-sectional area of the trace, which is proportional to the width of the trace.

Therefore, when the lengths of the plurality of compensation traces 22 are equal, widths of the first compensation trace 22 to the middle compensation trace 22 in a one-to-one correspondence with the first one of the traces 11 in a fan-shaped distribution to the middle one of the traces 11 in a fan-shaped distribution decrement, and widths of the middle compensation trace 22 to the last compensation trace 22 in a one-to-one correspondence with the middle one of the traces 11 in a fan-shaped distribution to the last one of the traces 11 in a fan-shaped distribution increment. In this way, resistance values of the first compensation trace 22 to the middle compensation trace 22 increment, and resistance values of the middle compensation trace 22 to the last compensation trace 22 decrement, thereby reducing the resistance value difference among the plurality of traces 11 in a fan-shaped distribution.

In the present embodiment, detailed widths of the plurality of compensation traces 22 may be set according to the resistance value difference among the plurality of traces 11 in a fan-shaped distribution. In detail, a sum of the resistance values of the first one of the traces 11 in a fan-shaped distribution and the first compensation trace 22 (or a sum of the resistance values of the last one of the traces 11 in a fan-shaped distribution and the last compensation trace 22) can be used as a reference, and then resistance values of other compensation traces 22 are set, so that the widths of the compensation traces can be set.

Figure 3:
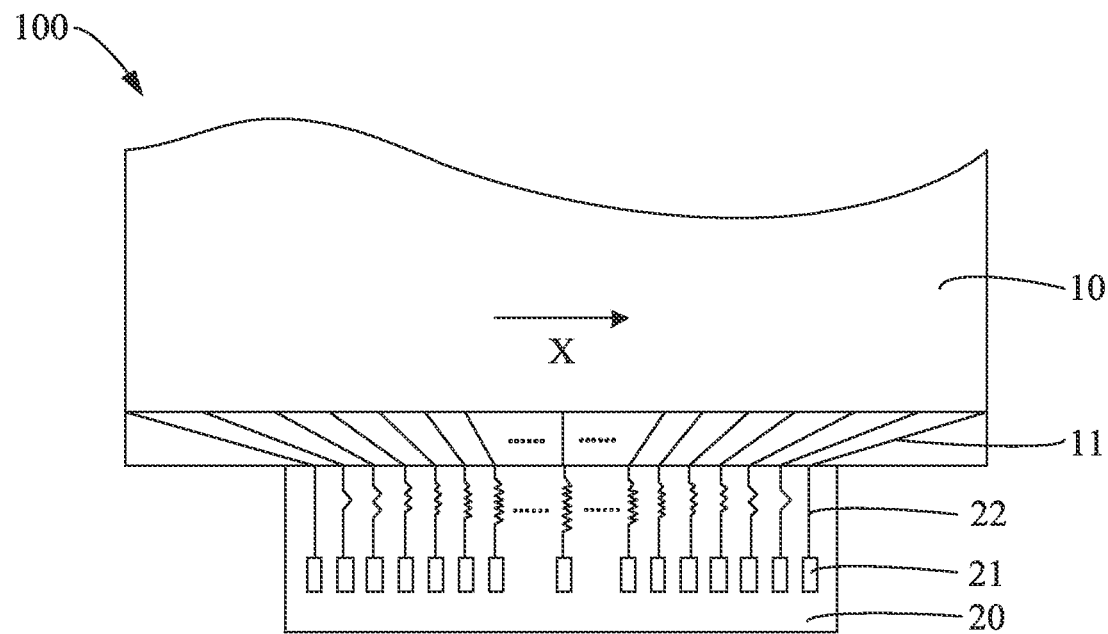
FIG. 3 is a schematic diagram of a second structure of a display device according to the present disclosure.

Referring to FIG. 3, FIG. 3 is a schematic diagram of a second structure of a display device according to the present disclosure.

A difference between the display device 100 provided in the present embodiment and the display device 100 shown in FIG. 1 is that widths of the plurality of compensation traces 22 are equal, lengths of the first compensation trace 22 to the middle compensation trace 22 increment, and lengths of the middle compensation trace 22 to the last compensation trace 22 decrement.

Similarly, it can be learned from the calculation formula of the resistance values of the traces that, when the widths of the plurality of compensation traces 22 are equal, lengths of the first compensation trace 22 to the middle compensation trace 22 in a one-to-one correspondence with the first one of the traces 11 in a fan-shaped distribution to the middle one of the traces 11 in a fan-shaped distribution increment, and lengths of the middle compensation trace 22 to the last compensation trace 22 in a one-to-one correspondence with the middle one of the traces 11 in a fan-shaped distribution to the last one of the traces 11 in a fan-shaped distribution decrement. In this way, resistance values of the first compensation trace 22 to the middle compensation trace 22 increment, and resistance values of the middle compensation trace 22 to the last compensation trace 22 decrement, thereby reducing the resistance value difference among the plurality of traces 11 in a fan-shaped distribution.

Figure 4:
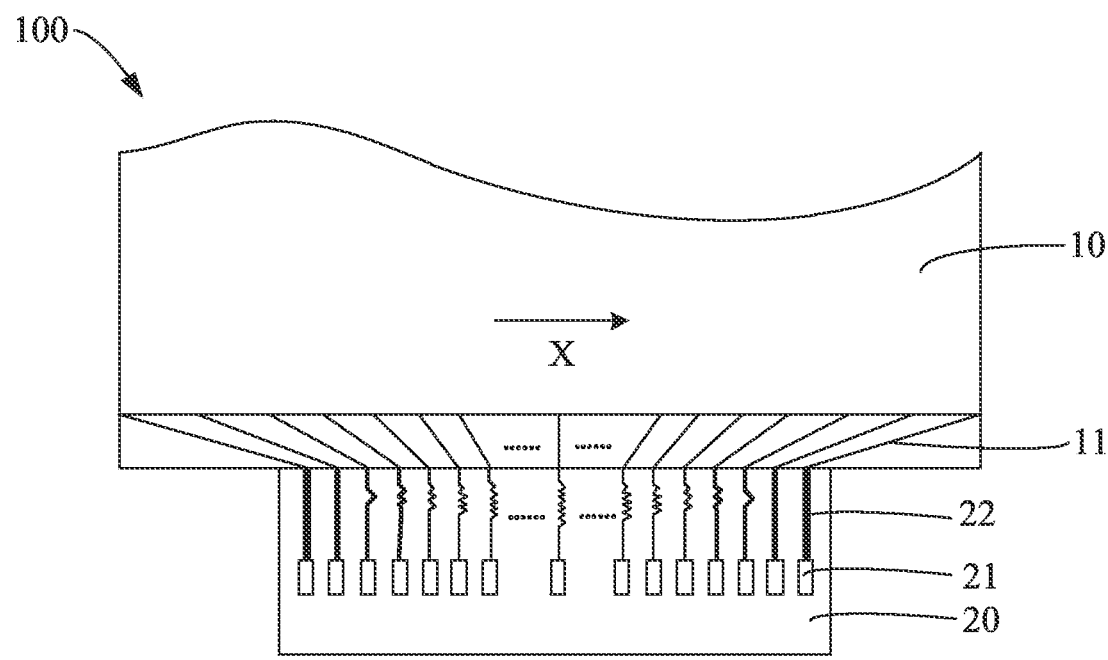
FIG. 4 is a schematic diagram of a third structure of a display device according to the present disclosure.

Referring to FIG. 4, FIG. 4 is a schematic diagram of a third structure of a display device according to the present disclosure.

A difference between the display device 100 provided in the present embodiment and the display device 100 shown in FIG. 1 is that lengths of the first compensation trace 22 to the middle compensation trace 22 increment, lengths of the middle compensation trace 22 to the last compensation trace 22 decrement, widths of the first compensation trace 22 to the middle compensation trace 22 decrement, and widths of the middle compensation trace 22 to the last compensation trace 22 increment.

It can be understood that when the resistance value difference among the plurality of traces 11 in a fan-shaped distribution is relatively large, due to the limited space in the source driving chip 20, only increasing the length or width of the corresponding compensation trace 22 may in turn cause the problems of short circuits or signal crosstalk as a result of dense arrangement of the plurality of compensation traces 22. Therefore, in the present embodiment, the length and the width of the same compensation trace 22 are simultaneously adjusted to change the resistance values of the compensation trace, thereby increasing a variation range of the resistance values of the compensation trace 22, and increasing a space utilization rate of the source driving chip 20.

Figure 5:
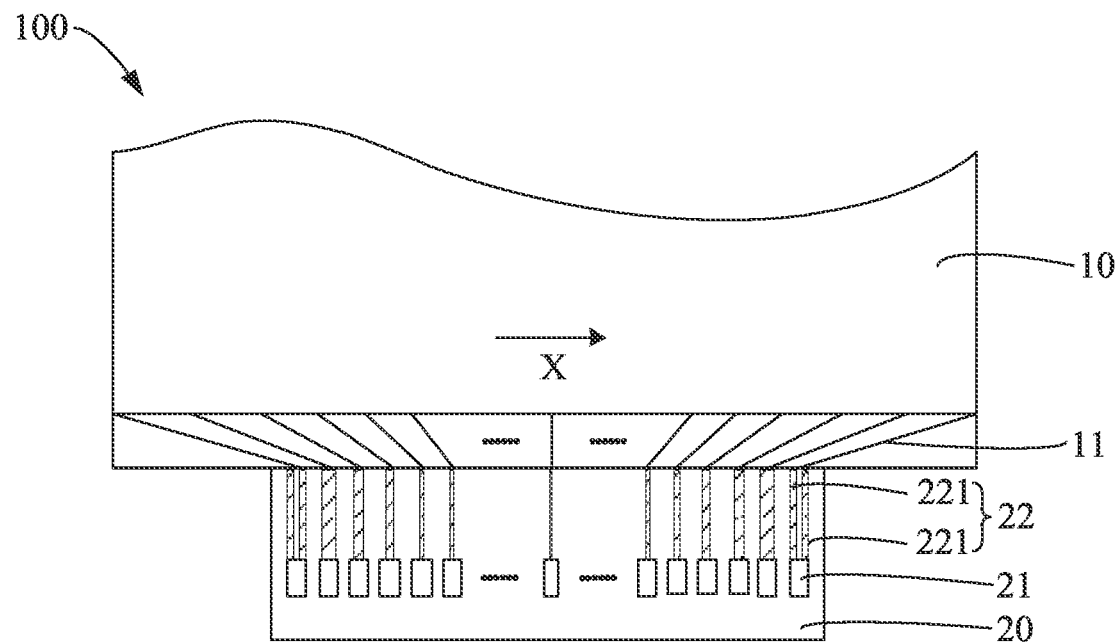
FIG. 5 is a schematic diagram of a fourth structure of a display device according to the present disclosure.

Referring to FIG. 5, FIG. 5 is a schematic diagram of a fourth structure of a display device according to the present disclosure.

A difference between the display device 100 provided in the present embodiment and the display device 100 shown in FIG. 1 is that at least one compensation trace 22 includes a plurality of compensation sub-traces 221 connected in parallel.

A quantity of compensation sub-traces 221 included in each compensation trace 22 can be set according to the resistance value of the compensation trace 22.

A length and a width of each compensation sub-trace 221 can also be set according to actual requirements.

Each compensation trace 22 includes a plurality of compensation sub-traces 221 connected in parallel.

In the display device 100 shown in FIG. 5, only that "in the first direction X, both the first compensation trace 22 and the last compensation trace 22 include two compensation sub-traces 221 connected in parallel" is used as an example, but this cannot be understood as a limitation on the present disclosure.

In the display device 100 provided in the present embodiment, at least one compensation trace 22 is disposed to include a plurality of compensation sub-traces 221 connected in parallel, which can effectively reduce the resistance value of the compensation trace 22, and can effectively reduce a voltage drop caused by trace impedance in the display device 100 during compensation for the resistance value difference among the plurality of traces 11 in a fan-shaped distribution, thereby improving charging efficiency of the display panel 10.

Figure 6:
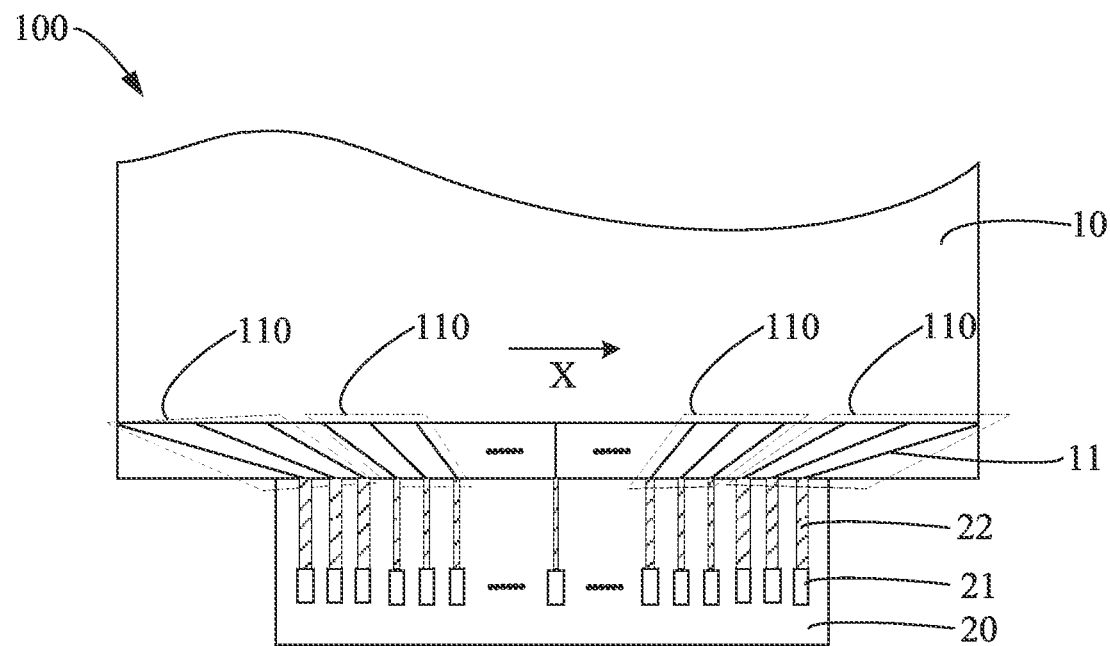
FIG. 6 is a schematic diagram of a fifth structure of a display device according to the present disclosure.

Referring to FIG. 6, FIG. 6 is a schematic diagram of a fifth structure of a display device according to the present disclosure. A difference between the display device 100 provided in the present embodiment and the display device 100 shown in FIG. 1 is that the display panel 10 includes a plurality of fan-shaped sub-areas 110, and each fan-shaped sub-area 110 includes a plurality of traces 11 in a fan-shaped distribution. Resistance values of the compensation traces 22 correspondingly connected to the traces 11 in a fan-shaped distribution in the each fan-shaped sub-area 110 are equal.

A quantity of traces 11 in a fan-shaped distribution included in each fan-shaped sub-area 110 can be set according to actual conditions, which is not limited in detail in the present disclosure.

In the present embodiment, the plurality of traces 11 in a fan-shaped distribution are divided by area, and the compensation traces 22 corresponding to the traces 11 in a fan-shaped distribution in each fan-shaped sub-area 110 are set to the same trace, thereby simplifying the process of the source driving chip 20 and improving the production efficiency while reducing the resistance value difference between the traces 11 in a fan-shaped distribution.

Further, in an embodiment of the present disclosure, quantities of traces 11 in a fan-shaped distribution included in each fan-shaped sub-area 110 are equal, which further reduces the process difficulty of producing the source driving chip 20.

In addition, the display device provided in the present disclosure can adopt a tri-gate driving architecture. In the tri-gate driving architecture, a quantity of scan lines is increased to three times a normal driving architecture, and a quantity of data lines is reduced to $\frac{1}{3}$ of the normal driving architecture. Therefore, a quantity of source driving chips in the tri-gate driving architecture is reduced to $\frac{1}{3}$ of the normal driving structure, the display area of the display panel controlled by each source driving chip is enlarged, and the resistance value difference among the plurality of traces in a fan-shaped distribution is relatively large. Therefore, the display device provided in the present disclosure adopts the tri-gate driving architecture, which can effectively reduce the resistance value difference among the plurality of traces in a fan-shaped distribution. In addition, the charging uniformity in the display panel can be more desirable, thereby enhancing display quality. It should be noted that the tri-gate driving architecture is a technology well known to those skilled in the art, and details are not described herein again.

Correspondingly, the present disclosure further provides an electronic device. The electronic device includes the display device described in any of the above embodiments. For details of the display device, reference may be made to the above content, and the details are not described herein again. In addition, the electronic device may be a smart phone, a tablet computer, an e-book reader, a smart watch, a video camera, a game console, and the like, which is not limited in the present disclosure.

The electronic device provided in the present disclosure includes a display device. The display device includes: a display panel, including a plurality of traces in a fan-shaped distribution; a source driving chip, in which a plurality of signal output terminals and a plurality of compensation traces are disposed, wherein the compensation traces are configured to reduce a resistance value difference among the plurality of traces in a fan-shaped distribution, the plurality of signal output terminals, the plurality of traces in a fan-shaped distribution, and the plurality of compensation traces are in a one-to-one correspondence, and each signal output terminal is electrically connected to a corresponding one of the traces in a fan-shaped distribution using one corresponding compensation trace. In the present disclosure, a compensation trace is arranged between each signal output terminal and a corresponding one of the traces in a fan-shaped distribution, so as to compensate for the resistance value difference among a plurality of traces in a fan-shaped distribution, thereby improving display unevenness of a display panel, and improving quality of an electronic device.

The display device and electronic device provided in the embodiments of this application have been described in detail above. Although the principles and implementations of this application are described by using specific examples in this specification, the descriptions of the foregoing embodiments are merely used for helping understand the method and the core idea of this application. Meanwhile, a person skilled in the art may make modifications to the specific implementations and application range according to the idea of this application. In conclusion, the content of this specification is not to be construed as a limitation to this application.

What is claimed is:

1. A display device, comprising:
   a display panel, comprising a plurality of traces in a fan-shaped distribution; and
   a source driving chip, in which a plurality of signal output terminals and a plurality of compensation traces are disposed, wherein the compensation traces are configured to reduce a resistance value difference among the plurality of traces in a fan-shaped distribution, the plurality of traces in a fan-shaped distribution, the plurality of signal output terminals, and the plurality of compensation traces are in a one-to-one correspondence, and each signal output terminal is electrically connected to a corresponding one of the traces in a fan-shaped distribution using one corresponding compensation trace;
   wherein lengths of a first compensation trace of the plurality of compensation traces to a middle compensation trace of the plurality of compensation traces increment, and lengths of the middle compensation trace to a last compensation trace of the plurality of compensation traces decrement.

2. The display device as claimed in claim 1, wherein the plurality of traces in a fan-shaped distribution are arranged at intervals in a first direction, in the first direction, resistance values of a first one of the traces in a fan-shaped distribution to a middle one of the traces in a fan-shaped distribution decrement, and resistance values of the middle one of the traces in a fan-shaped distribution to a last one of the traces in a fan-shaped distribution increment;
   resistance values of the first compensation trace to the middle compensation trace in a one-to-one correspondence with the first one of the traces in a fan-shaped distribution to the middle one of the traces in a fan-shaped distribution increment, and resistance values of the middle compensation trace to the last compensation trace in a one-to-one correspondence with the middle one of the traces in a fan-shaped distribution to the last one of the traces in a fan-shaped distribution decrement.

3. The display device as claimed in claim 2, wherein widths of the plurality of compensation traces are equal.

4. The display device as claimed in claim 3, wherein the compensation traces are in a shape of a broken line or a straight line.

5. The display device as claimed in claim 1, wherein distances between the plurality of signal output terminals and the corresponding traces in a fan-shaped distribution are equal.

* * * * *